(12) United States Patent
Keuss (10) Patent No.: US 7,996,165 B2
(45) Date of Patent: Aug. 9, 2011

(54) PORTABLE HEAVY LOAD BATTERY TESTING SYSTEM AND METHOD

(75) Inventor: Steven D. Keuss, Brentwood, MO (US)

(73) Assignee: Associated Equipment Corp., St. Louis, MO (US)

( * ) Notice: Subject to any disclaimer, the term of this patent is extended or adjusted under 35 U.S.C. 154(b) by 445 days.

(21) Appl. No.: 12/246,696

(22) Filed: Oct. 7, 2008

(65) Prior Publication Data

US 2010/0088050 A1 Apr. 8, 2010

(51) Int. Cl.
*G01R 31/36* (2006.01)
*H02J 7/00* (2006.01)
*G01N 27/416* (2006.01)

(52) U.S. Cl. .......................... 702/63; 320/149; 324/426

(58) Field of Classification Search .................. 702/63, 702/182; 324/426, 430; 320/104, 149
See application file for complete search history.

(56) References Cited

U.S. PATENT DOCUMENTS

| | | | |
|---|---|---|---|
| 3,840,808 A | 10/1974 | Liebermann | |
| 4,423,378 A | 12/1983 | Marino et al. | |
| 4,956,597 A | 9/1990 | Heavey et al. | |
| 5,523,671 A | 6/1996 | Stewart | |
| 5,804,944 A | 9/1998 | Alberkrack et al. | |
| 5,808,443 A | 9/1998 | Lundstrom | |
| 5,895,440 A | 4/1999 | Proctor et al. | |
| 6,037,778 A | 3/2000 | Makhija | |
| 6,144,185 A | 11/2000 | Dougherty et al. | |
| 6,313,608 B1 | 11/2001 | Varghese et al. | |
| 6,544,078 B2 | 4/2003 | Palmisano et al. | |
| 6,623,314 B1 | 9/2003 | Cox et al. | |
| 6,667,624 B1 | 12/2003 | Raichle et al. | |
| 6,771,073 B2 | 8/2004 | Henningson et al. | |
| 6,777,945 B2 | 8/2004 | Roberts et al. | |
| 6,781,382 B2 | 8/2004 | Johnson | |
| 7,031,855 B2 | 4/2006 | Mottola | |
| 7,081,755 B2 | 7/2006 | Klang et al. | |
| 7,089,127 B2 | 8/2006 | Thibedeau et al. | |
| 7,116,109 B2 | 10/2006 | Klang | |
| 7,148,657 B2 | 12/2006 | Raichle et al. | |
| 7,295,936 B2 | 11/2007 | Bertness et al. | |
| 7,693,671 B2 * | 4/2010 | Okumura et al. ............... 702/63 |
| 2002/0107794 A1 | 8/2002 | Furphy et al. | |
| 2006/0091857 A1 * | 5/2006 | Nakanishi et al. ............ 320/116 |

* cited by examiner

*Primary Examiner* — Bryan Bui
(74) *Attorney, Agent, or Firm* — Polsinelli Shughart PC (57) ABSTRACT

A portable measurement device and method for measuring a parameter value of a battery. The measurement device connects a large resistive load to a battery being tested. The load is connected to the battery through a first set of kelvin connected clamps and a switch. A microprocessor measures open and closed circuit voltages via a second set of kelvin connected jaws. The microprocessor determines voltage drop curve data based on the measure open and closed circuit voltages. The microprocessor compares the voltage drop curve data to voltage drop profile data for a particular parameter to determine the parameter value for the battery.

27 Claims, 6 Drawing Sheets

PORTABLE HEAVY LOAD BATTERY TESTING SYSTEM AND METHOD

RELATED APPLICATIONS

Not Applicable

FEDERALLY SPONSORED RESEARCH OR DEVELOPMENT

Not Applicable.

COMPACT DISK APPENDIX

Not Applicable.

BACKGROUND

The capacity of a battery, such as a vehicle battery, may diminish over time due to, for example, over discharge on the battery or extreme heat. As a result, the battery may be unable to provide an amount of electrical energy necessary to start the vehicle and/or operate various vehicle electrical systems. Determining the capacity of a battery generally requires testing the battery while drawing a current. For example, one commonly accepted test for measuring the capability of a battery is to measure the amount of current a battery can provide at a given temperature for a fixed period of time while maintaining a set voltage. This measured current is generally referred to as cold cranking amps (CCA).

One conventional method for determining the capacity of a vehicle battery involves measuring the internal resistance or dynamic conductance of the battery. Measuring the internal resistance of the vehicle battery typically involves applying two different DC currents to the battery, calculating the difference in the voltage readings, and determining the internal resistance as a function of the different voltage readings. In some systems, the internal resistance of the battery is typically measured using a very high direct current for (e.g. 50 amps or more) to minimize the effect of changes in internal resistance due to change in the test current. Thereafter, the measured internal resistance or dynamic conductance values are compared to the size and state of the charge of the battery while it is under a current test to determine its condition. However, there are disadvantages associated with conventional systems that use high direct current. For example, high direct current methods typically require very bulky and expensive test equipment and require the battery to have enough charge in order to perform the test. In addition, such high direct current methods require the use of very high currents, which can temporarily alter the condition of the battery such that test results are not repeatable.

Another conventional method for determining the condition of a battery involves measuring the dynamic conductance/resistance of the battery by applying a time varying voltage, such as an alternating current voltage, and making periodic step transitions at a pre-determined frequency between two discrete voltage levels. Alternatively, the dynamic conductance/resistance of the battery can be measured by applying a time varying discharge current and making periodic transitions between two discrete current levels at a pre-determined frequency. At least one disadvantage with such method is that the dynamic conductance/resistance varies significantly with the state of charge, and it is difficult to measure the exact state of charge in batteries that are significantly discharged.

SUMMARY

The present invention overcomes the disadvantages of conventional battery testing systems by providing a heavy load battery tester that is highly portable, user friendly, and cost effective.

According to one aspect, a portable measurement device is provided for determining a parameter of a battery. The portable measurement device includes a first contactor to connect to a first terminal of the battery, the first contactor comprising a first pair of leads. The portable measurement device also includes a second contactor to connect to a second terminal of the battery, the second contactor comprising a second pair of leads. The portable measurement device also includes a housing that contains a measurement circuit. The measurement circuit includes a switch to selectively connect a resistive load to the battery via one of the first pair of leads and one of the second pair of leads. The measurement device also includes an analog to digital (AD) converter connected to the battery via another one of the first pair of leads and another one of the second pair of leads. The AD converter receives a first voltage from the battery before the resistive load is connected to the battery and converts the first voltage to a first digital signal. The AD converter also receives a second voltage from the battery after the resistive load is connected to the battery and converts the second voltage to a second digital signal. The AD converter also receives a third voltage from the battery after the resistive load is disconnected from the battery and converts the third voltage to a third digital signal. The measurement circuit also includes a microcontroller that calculates voltage drop data as a function of the first, second, and third digital signals. The microcontroller also retrieves voltage profile data corresponding to a desired parameter from a memory. The microcontroller also compares the voltage drop data to the voltage profile data to determine a value of the desired parameter. The portable measurement device also includes a display to generate the value of the desired parameter for display.

According to another aspect, a system is provided for obtaining a parameter measurement of a battery. The system includes a hand-held parameter measurement device. The hand-held parameter measurement device includes a first contactor to connect to a first terminal of the battery. The first contactor includes a first pair of leads. The hand-held parameter measurement device also includes a second contactor to connect to a second terminal of the battery. The second contactor comprises a second pair of leads. The hand-held parameter measurement device also includes a switch that selectively connects a resistive load to the battery via one of the first pair of leads and one of the second pair of leads. The hand-held parameter measurement device also includes an analog to digital (AD) converter connected to the battery via another one of the first pair of leads and another one of the second pair of leads. The AD converter receives a first voltage from the battery before the resistive load is connected to the battery and converts the first voltage to a first digital signal. The AD converter also receives a second voltage from the battery after the resistive load is connected to the battery and converts the second voltage to a second digital signal. The second voltage decreases from a maximum level to a minimum level over a period time. The hand-held parameter measurement device also includes a processor that determines a first open circuit voltage (OCV) as a function of the first digital signal and to determine a plurality of closed circuit voltage values (CCVs) as a function of the second digital signal over the period of time. The processor also includes modules that are executable on the processor. A voltage curve module defines voltage drop curve data as a function of the OCV and the plurality CCVs. A profile retrieval module retrieves profile data corresponding to a voltage drop profile for a desired parameter. A comparison module compares the voltage drop data to the profile data to determine a value of the desired parameter. A display module generates the value of the desired parameter for display on a display.

According to another aspect, a method is provided for measuring a parameter of a battery. The method includes connecting a first pair of leads to a first terminal of the battery. The method also includes connecting a second pair of leads to a second terminal of the battery. The method also includes selectively connecting a resistive load to the battery via one of the first pair of leads and one of the second pair of leads. The method also includes connecting an analog to digital (AD) converter to the battery via another one of the first pair of leads and another one of the second pair of leads. The method also includes receiving a first voltage at the AD converter from the battery before connecting the resistive load. The method also includes converting the first voltage to a first digital signal at the AD converter. The method also includes receiving a second voltage at the AD converter from the battery after connecting the resistive load. The second voltage decreases from a maximum level to a minimum level over a period time. The method also includes converting the second voltage to a second digital signal at the AD converter. The method also includes receiving a third voltage at the AD converter from the battery after disconnecting the resistive load from the battery. The method also includes converting the third voltage to a third digital signal at the AD converter. The method also includes processing the first, second, and third digital signals at a processor to calculate voltage drop data. The method also includes retrieving, at the processor, voltage profile data corresponding to a desired parameter from a memory and comparing the voltage drop data to the voltage profile data to determine a value of the desired parameter. The method also includes generating the value of the desired parameter for display.

DETAILED DESCRIPTION

Figure 1:
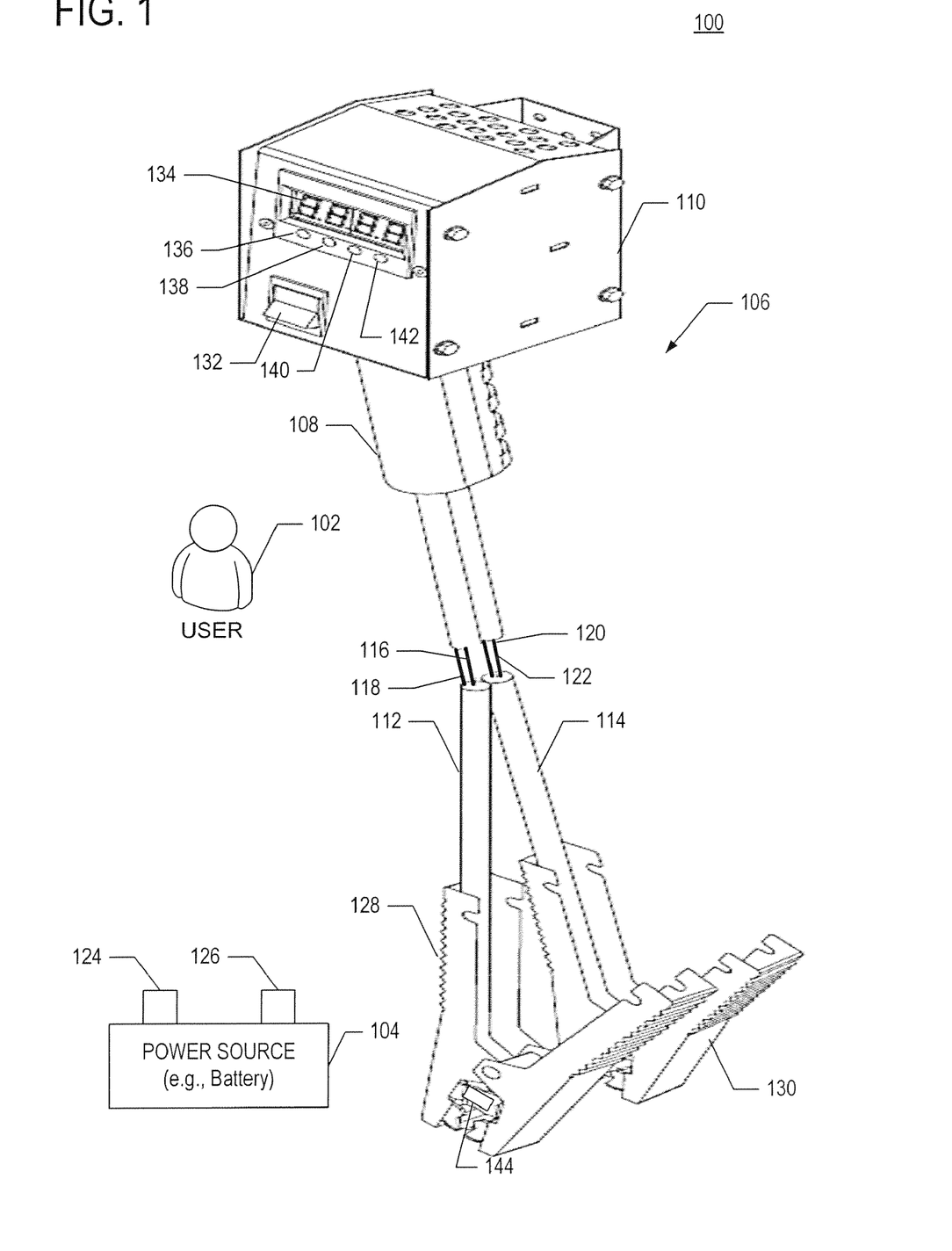
FIG. 1 depicts a portable measurement device for measuring a parameter of a battery according to one aspect of present invention.

FIG. 1 depicts an exemplary aspect of a battery parameter measurement system ("measurement system") 100. The measurement system 100 enables a user 102 to measure a parameter, such as a cold cranking amperage (CCA), of a power source 104 with a portable measurement device 106. Although the invention is described herein as being used to determine a CCA parameter of the power source 104, such as a vehicle battery, it is contemplated that the methods and systems described herein could be used to measure other operating parameters, such as cranking amps (CA), ampere hour (AH), watt-hour (WHr), and reserve capacity (RC).

Figure 2:
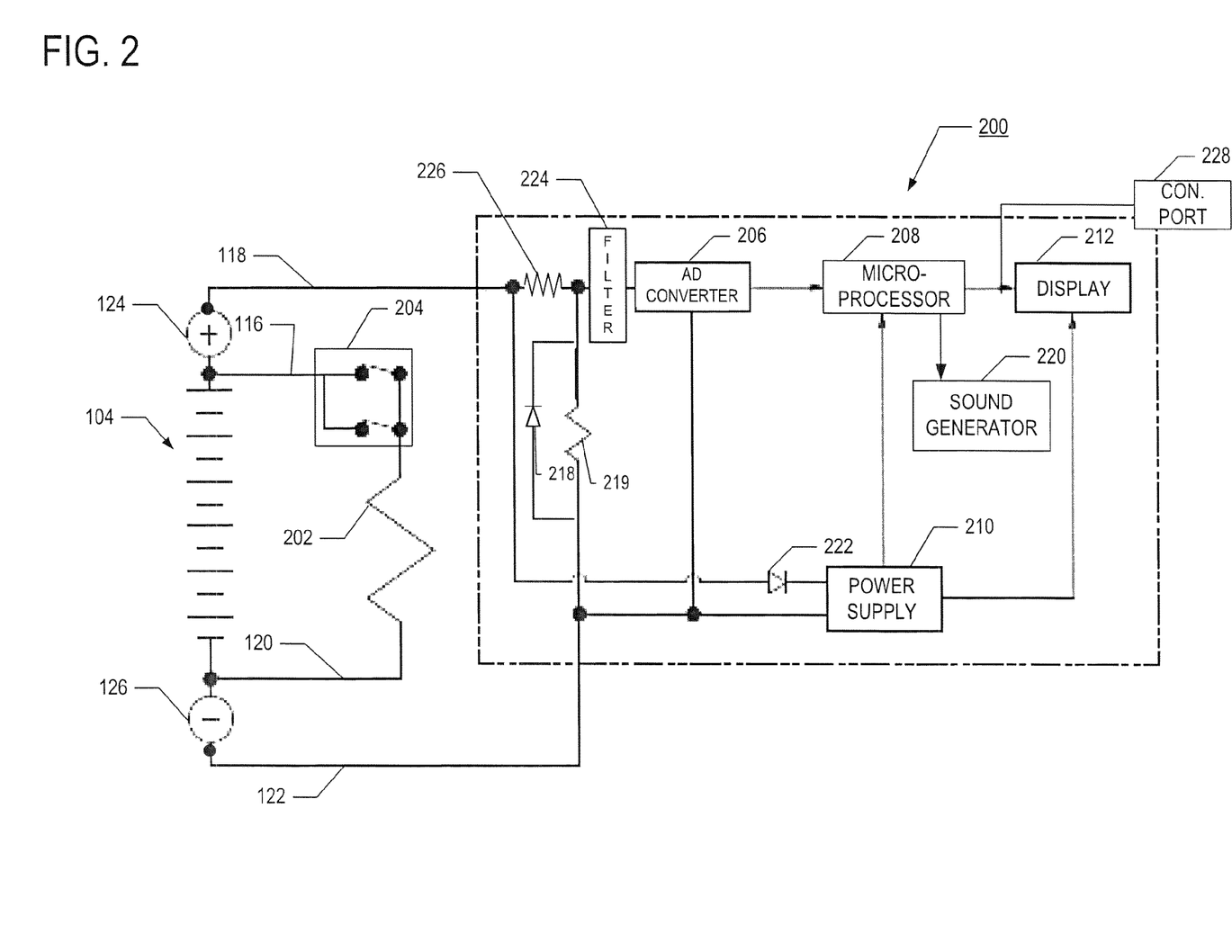
FIG. 2 depicts circuit components of the portable measurement device according to one aspect of the invention.

The portable measurement device 106 comprises a handle 108 attached to an enclosure 110 that houses an electronic circuit (see FIG. 2). The electronic circuit is configured to measure at least one operating parameter of the battery 104 based on electrical energy received from the battery 104 via a pair of cables 112, 114. Each of the cables 112, 114 includes at least two lead wires. For example, the first cable 112 includes lead wires 116, 118 and the second cable 114 includes lead wires 120, 122. The lead wires 116-122 connect to the electronic circuit, which includes a resistive load, and to terminals 124, 126 of the battery 104 via Kelvin connection inside clamps 128, 130.

The portable measurement device 106 also comprises a switch 132 for initiating measurement of the parameter and a display 134 for displaying measurement information to the user 102. The display 134 is, for example, a 7-segment display, a light emitting diode (LED), or a liquid crystal display (LCD).

FIG. 2 depicts an electronic circuit ("circuit") 200 of the portable measurement device 106 according to one aspect of the measurement system 100. The circuit 200 comprises a resistive load 202, a switch 204 (e.g., switch 134), an analog-to-digital (AD) converter 206, a microprocessor 208, a power supply 210, and a display 212.

As described above, the circuit 200 is connected to the power source (e.g. battery 104) via a kelvin connection through the leads 116-122 and kelvin clamps 128, 130. The kelvin connection allows the resistive load 202 to be connected to the battery 104 via the switch 204 and through a first set of leads (e.g., leads 116, 120), and allows the voltage differential across the terminals 124 and 126 of the battery 104 to be measured through a second set of leads (e.g., leads 118, 122). For example, the lead wire 116 from the first cable 112 connects the positive battery terminal 124 to the load switch 204, which then connects to the resistive load 202. The lead wire 120 from the cable 114 connects the negative battery terminal 126 to the resistive load 202. Collectively, lead wires 116, 120 are loading leads. Lead wire 118 from cable 112 connects the positive battery terminal 124 to the AD converter 206 and the lead wire 122 from cable 114 connects the negative battery terminal 126 to the AD converter 206. Collectively, lead wires 118, 122 are voltage sensing leads. In other words, the first set of leads 116, 120, or loading leads, load the battery 104 with the resistive load 202 while the second set of leads 118, 122, or voltage sensing leads, are used to measure the battery voltage.

According to one aspect, the resistive load is rated at 12 volts and 120 amps and is connected in series with the switch 204. However, it is contemplated that a resistive load with lower amperage rating (e.g., 60 amps) may be used in other aspects. For example, a resistive load with a lower amperage rating may be used when measuring smaller batteries or to measure the RC parameter.

According to one aspect, the switch 204 is, for example, a double pole switch model number RTPX44X412M9, such as manufactured by OSLO Controls, Inc. located in Chesire, Conn.

According to another aspect, a first diode 218 is connected in parallel between the battery 104 and the AD converter 206 to limit the peak reverse voltage applied to the AD converter 206. A second diode 222 is connected to the positive input of the power supply 210 to prevent reverse current flow when battery connections are reversed. On a low voltage unit, the second diode 222 may be a Shockley diode. A DC offset filter 224 and resistor 226 is connected between the battery 104 and the AD converter 206.

According to yet another aspect (not shown), the portable measurement device 106 enables bipolarity connections between the battery 104 and the power supply 210 by incorporating a bridge rectifier (not shown) and a DC offset filter between the battery 104 and the AD converter 206.

The power supply 210 is connected to the battery 104 to receive DC power and provides the required operating power (i.e., supply voltage) for operating the microprocessor 208 and the display 212. For example, the power supply 210 may comprise a voltage regulator circuit to reduce the DC voltage supplied from the battery 104 to a minimal voltage level required for operating the microprocessor 208 and the display 212.

The AD converter 206 receives the battery voltage via the voltage leads 118, 122. For example, upon connection of the cables 112, 114 to the battery 104 via the kelvin clamps 128, 130, and prior to closing the switch 204, the AD converter 206 receives an open circuit voltage (OCV) and generates an output OCV digital signal. The microprocessor 208 receives the OCV digital signal and calculates a first OCV value based on the OCV digital signal.

According to one aspect, the microprocessor 208 comprises a memory (see FIG. 3) that stores measured data, such as the calculated OCV value. According to another aspect, the microprocessor is connected to a connection port 228, such as a Universal Serial Bus (USB) port, for receiving a removable memory device, such as a USB flash drive. The connection port 228 can also be configured as a communication port such that measured data can be communicated via wired and/or wireless communication techniques. As such, measured voltage data and calculated parameter data can be transferred or transmitted from the portable measurement device 106 to a remote computing device, such as a personal computer or printer.

After the switch 204 is closed, the resistive load 202 is connected to the battery 104 and the DC voltage from battery 104 begins to drop. The AD converter 206 receives the closed circuit voltage (CCV) and generates an output CCV digital signal. The microprocessor 208 receives the output CCV digital signal, periodically calculates a CCV value based on the received output CCV digital signal, and stores the calculated CCV values in the memory. According to one aspect, the microprocessor 208 continues periodically calculating and storing CCV values until the CCV levels (i.e. the DC voltage from battery stops dropping).

The microprocessor 208 then transmits an alert signal to the display 212 to alert the user 102 to toggle the switch 204 (i.e., open the switch) to disconnect the resistive load 202 from the battery 104. The display 212 displays a message, such as "Disconnect Load" in response to the alert signal. According to another aspect, the portable measurement device 106 comprises a sound generator 220 that generates an audible alert in response to the alert signal. According to yet another aspect, the switch 204 is a relay that automatically disconnects the resistive load 202 from the battery 104 in response to the alert signal received from the microprocessor 208.

After the switch 204 is opened, the AD converter 206 receives a second open circuit voltage (OCV) and generates second output OCV digital signal. The microprocessor 208 receives the second OCV digital signal, calculates a second OCV value based on the second OCV digital signal, and stores the second OCV value in the memory.

Figure 3:
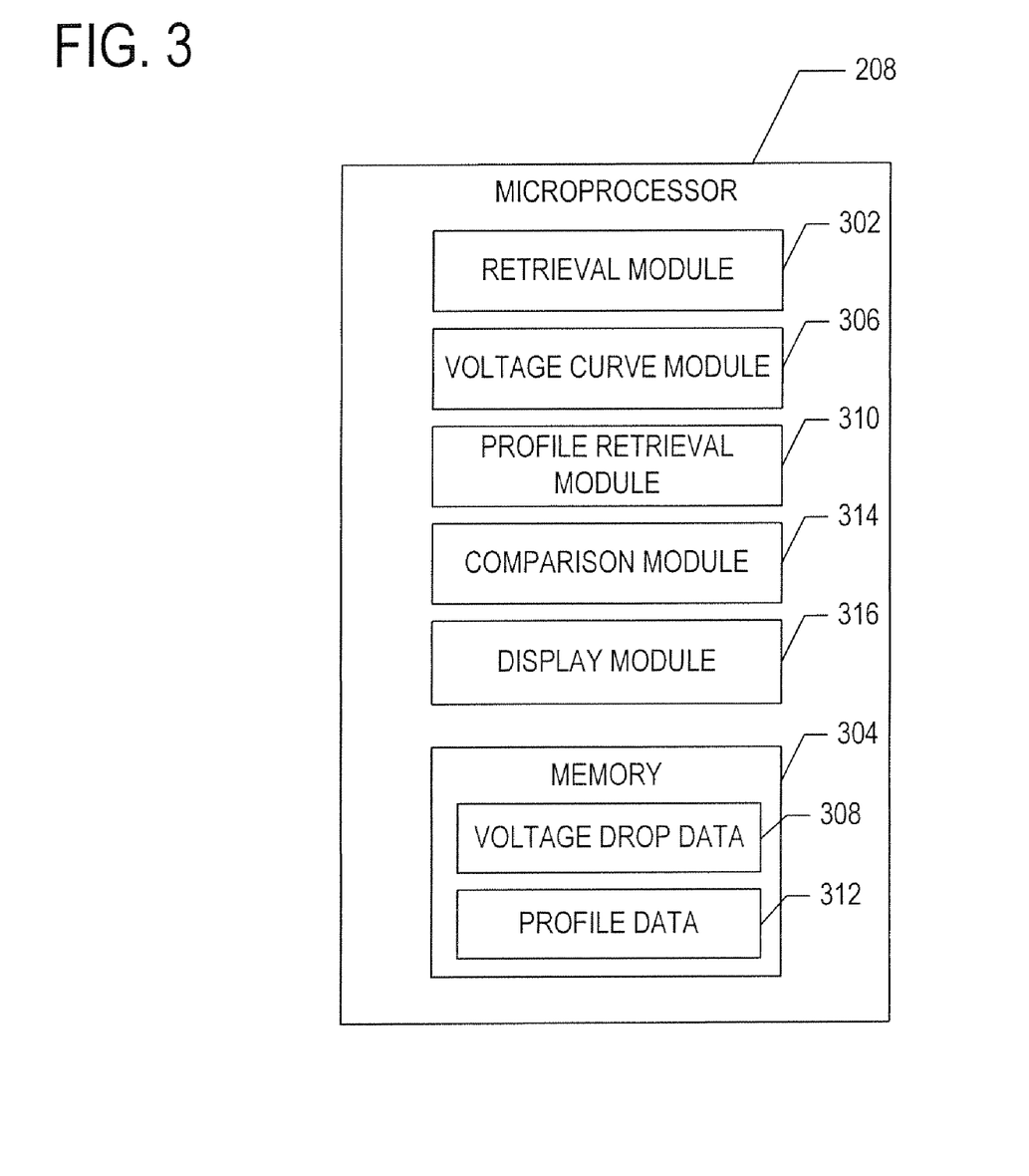
FIG. 3 depicts modular components of a microprocessor for calculating parameters of a battery.

As explained in more detail in reference to FIG. 3, the microprocessor 208 calculates various battery operating parameters based on the first OCV value, the CCV values, and the second OCV value. For example, the microprocessor 208 calculates a cold cranking amperage (CCA) parameter for the battery as a function of the OCV, the series of CCV measurements, and the second OCV. Thereafter, the microprocessor 208 transmits the calculated parameter to the display 212 for display to the user 102.

According to another embodiment, at least one of the kelvin clamps 128, 130 includes a temperature sensor (e.g., see reference character 144 in FIG. 1), such as thermocouple, that generates an analog temperature signal (i.e., voltage) that corresponds to a temperature of the terminal to which the kelvin clamps is connected. The AD converter 206 receives the analog temperature signal and converts the analog temperature signal to a digital temperature signal. The microprocessor 208 receives the digital temperature signal, determines a temperature value, and stores the temperature value in the memory. The temperature sensor 144 could also transmit a digital signal directly to the microprocessor with the temperature information. Thereafter, the microprocessor 208 can transmit the determined temperature value to the display 212 for display to the user 102, and/or use the temperature value to calculate the battery operating parameters. For example, the temperature of the battery directly affects the CCV values causing them to read lower at lower temperature therefore knowing the temperature can improve the accuracy of the CCA calculation.

FIG. 3 depicts components of a microprocessor 208 for calculating parameters of a battery 104 according to one aspect of the measurement system 100. The microprocessor 208 comprises executable modules or instructions that enable the microprocessor 208 to process OCV and CCV data and to calculate battery operation parameters, such as a cold cranking amperage (CCA) parameter.

A retrieval module 302 retrieves OCV values and CCV values from a memory 304. For example, after the microprocessor 208 receives the second OCV digital signal and determines the second OCV value, the microprocessor 208 executes the retrieval module 302 to retrieve the first OCV value and the series of CCV values from the memory 304.

A voltage curve module 306 defines a voltage drop curve (see FIG. 4A and 4B) based on the first and second OCV values and the series of CCV values retrieved from the memory 304. According to one aspect, the voltage curve module 306 calculates incremental voltage drops based on OCV values and the series of CCV values. For example, a first voltage drop is determined based on the difference between the second OCV value and the first CCV value determined after the switch 204 has been closed. Thereafter, a second voltage drop is determined between the first CCV value and the next CCV value in the series of CCV values. This process continues until voltage drops have been calculated between each of the remaining CCV values successively. The voltage curve module 306 defines the voltage drop curve based on the calculated voltage drop data and stores the voltage data 308 in the memory 304.

A profile retrieval module 310 retrieves profile data 312 corresponding to a voltage drop profile (see FIGS. 4A and 4B) that corresponds to a particular parameter. According to one aspect, the voltage drop profile is defined for the particular parameter based on historical data collected during observed voltage drops for batteries having known parameter values. For example, a resistive load is applied to a plurality of batteries, each having a known parameter value, and voltage drop curve data are determined for each battery.

A comparison module 314 compares the voltage drop data 308 to the profile data 312 to determine a parameter value for the battery 104. According to one aspect, the comparison module 314 compares the voltage drop curve of the battery 104 to a voltage drop profile and determines the parameter value based on an intersection point between voltage drop curve and the voltage drop profile.

Figure 4A:
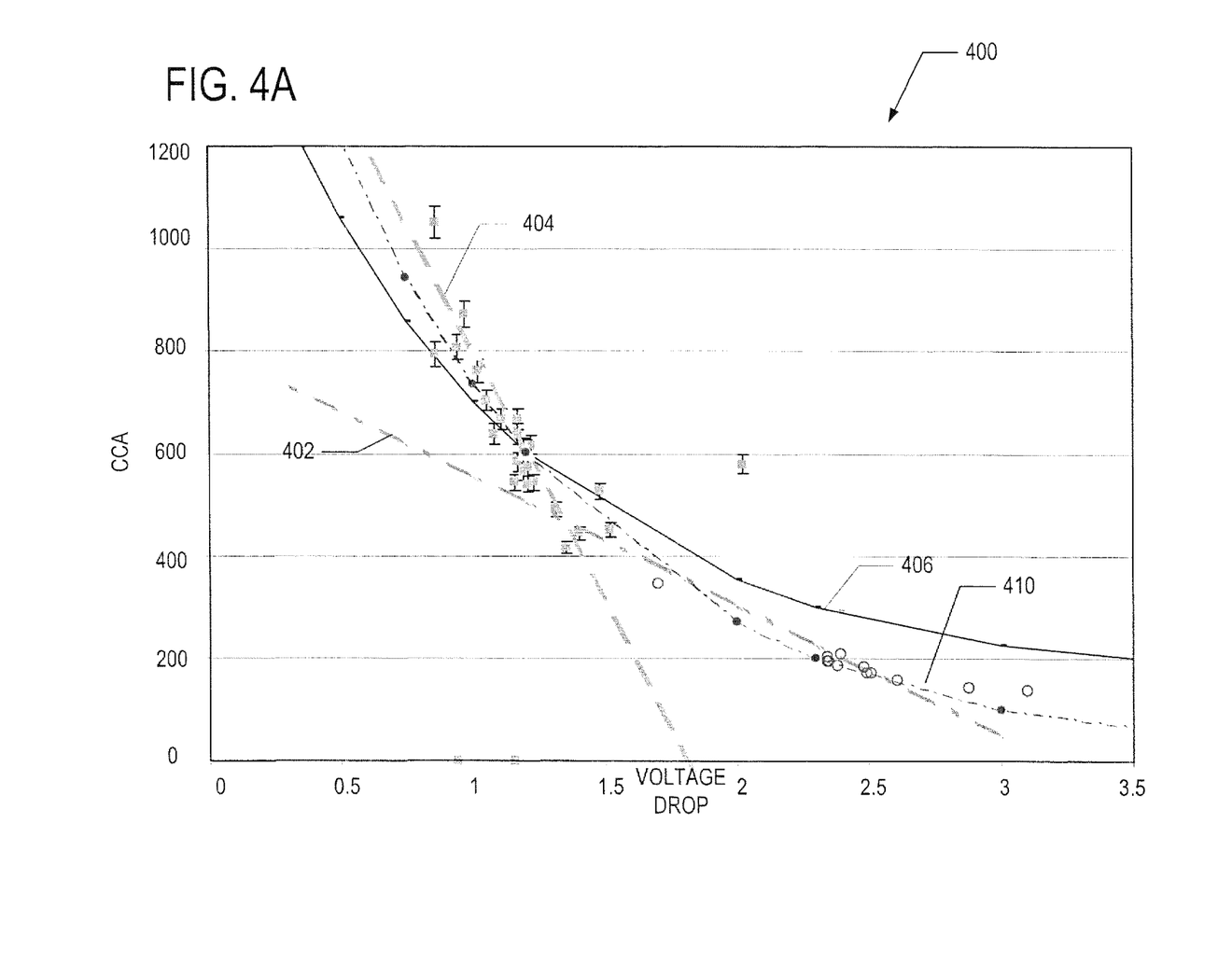
FIGS. 4A and 4B are charts illustrating voltage drop profiles.

FIGS. 4A depict exemplary voltage drop profiles for determining CCA values. FIG. 4A is graph 400 that depicts a first profile 402 that can be used to estimate CCA values less than 450 and a second profile 404 that can be used to estimate CCA values equal to or greater than 450. Profiles 402 and 404 are straight-line approximations that can be used to estimate CCA based on a calculated voltage drop. The vertical axis of the graph 400 corresponds to CCA values and the horizontal axis corresponds to the voltage drop values. The CCA value for the battery 104 can be determined by identifying the intersection between the calculated voltage drop and one of the first or second profiles 402, 404.

According to one aspect, the particular one of the profiles 402, 404 that is used to estimate the CCA depends on the magnitude of the calculated voltage drop. For example, the intersection point of the two voltage profiles 402, 404 defines a threshold voltage drop value. This threshold voltage drop value is compared to the calculated voltage drop to determine which one of the two profiles 402, 404 to use for estimating the CCA. As an example, the intersection between the two profiles shown in FIG. 4A defines a threshold voltage of approximately 1.35 volts. If the total calculated voltage drop is less than the threshold voltage drop value (e.g., 1.35 volts), then the profile 404 is used to determine the CCA. Alternatively, if the voltage drop is greater than the threshold voltage drop value (e.g., 1.35 volts), the second profile 402 is used.

According to another aspect, the exponential approximations profiles 406 and 410 can be used to estimate the CCA. Profiles 406 and 410 are exponential approximations that can be used to estimate CCA based on a calculated voltage drop using similar techniques described in connection with profiles 402, 404.

Figure 4B:
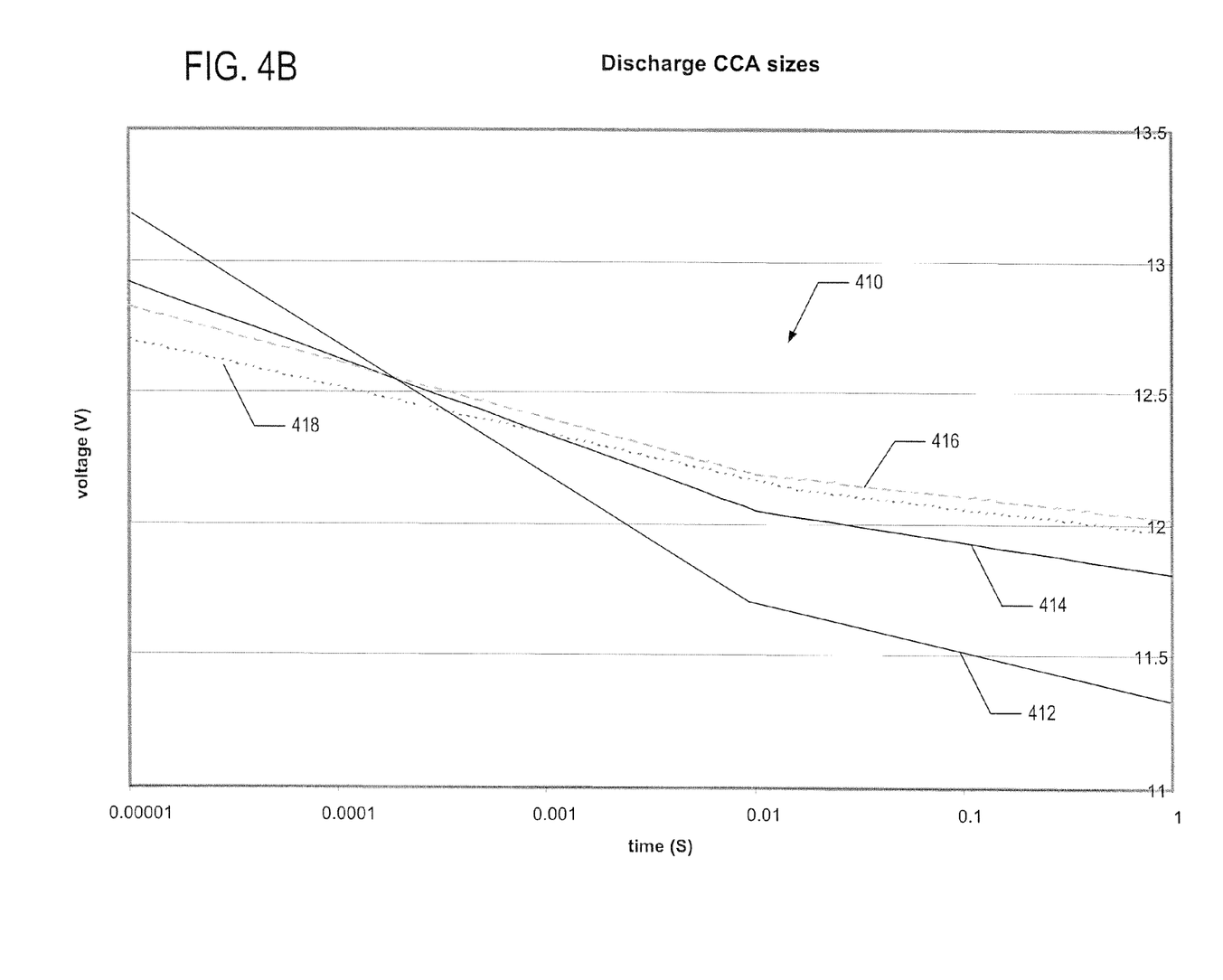

FIG. 4B is a graph 410 showing voltage drop or discharge slopes 412-418 for various battery CCA sizes while having a load placed on them. For example, the discharge slope 412 corresponds to a battery having a CCA of 323, discharge slope 414 corresponds to a battery having a CCA of 563, discharge slope 416 corresponds to a battery having a CCA of 650, and discharge slope 418 corresponds to a battery having a CCA of 853. By plotting the OCV values before and after loading and the series of CCV values, various operating parameters can be determined for a particular battery. In this example, if the particular battery has a slope that matches curve 418 and taking the $1^{st}$ and $2^{nd}$ OCV as a multiplying factor we would state the CCA of this battery to be around 850.

Although the CCA is described herein as being determined as a function of the observed voltage drops, a state of charge of the battery, a temperature of the battery, a time the load is on, and a slope the voltage takes with the load on, or any other variable that could effect voltage measurement can be factored into determining voltage profiles and/or voltage drop data.

Referring back to FIG. 3, a display module 316 displays the calculated CCA on the display 134. According to one aspect, the display module 316 cycles through various operating parameter values for display. For example, the display module 316 cyclically displays the battery voltage, maximum voltage, minimum voltage, and the CCA value.

According to another aspect, the portable measurement device 106 comprises a plurality of Light Emitting Diodes (LED) 136-142 (see FIG. 1) that are each labeled to correspond to battery voltage, a maximum voltage, a minimum voltage, and the CCA value. The display module 312 is further provides a voltage to the particular LED that corresponds to the particular value being displayed on the display 134 and the particular LED lights to indicate to the user 102 the particular type of value that is being displayed.

Figure 5:
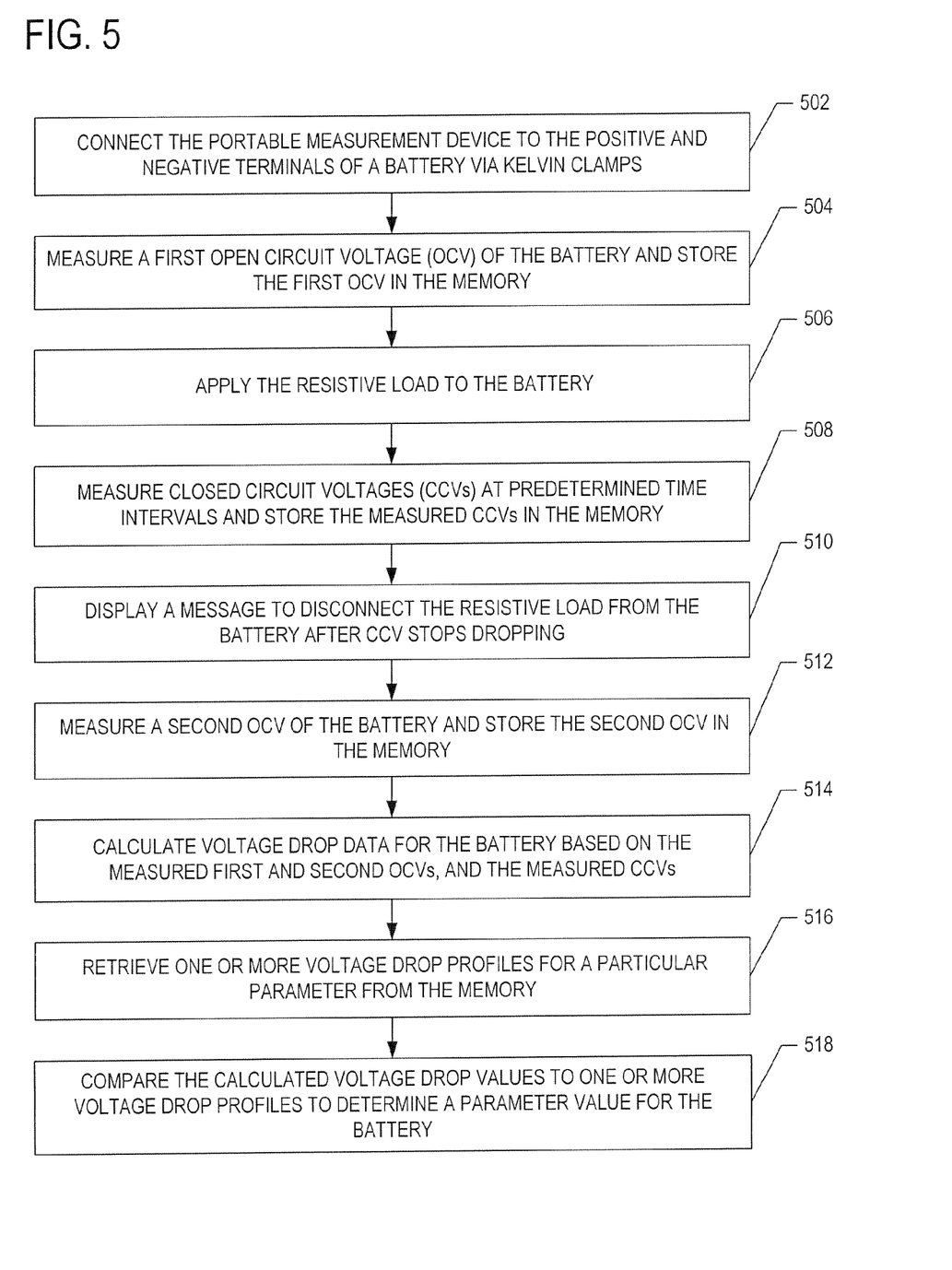
FIG. 5 is a flow chart illustrating a method for measuring a parameter of a battery.

FIG. 5 is a flow chart illustrating a method for measuring a parameter of a battery 104. At 502, the user 102 connects the pair of cables, 112 and 114 to the positive and negative terminals of a battery via kelvin clamps 128, 130, respectively. The portable measurement device 106 measures a first open circuit voltage of the battery 104 and stores the first OCV in the memory 304 at 504. At 506, the user 102 applies the resistive load 202 to the battery 104 via the switch 204. The portable measurement device 106 measures closed circuit voltages at predetermined time intervals (e.g. 1 second) and stores the measured CCVs in the memory at 508. The portable measurement device 106 continues measuring the closed circuit voltages until the CCV stops dropping or a maximum allowable time is reached. At 510, after the CCV stops dropping, the portable measurement device 106 displays a message to the user 102 to disconnect the resistive load 202 from the battery 104. The portable measurement device 106 measures a second OCV of the battery 104 and stores the second OCV in the memory 304 at 512

At 514 the portable measurement device 106 calculates voltage drop data for the battery 104 based on the measured first and second OCVs, and the measured CCVs. The portable measurement device 106 then retrieves one or more voltage drop profiles for a particular parameter from the memory at 516. At 518 the portable measurement device 106 compares the calculated voltage drop values to one or more voltage drop profiles to determine a parameter value for the battery 104.

In operation, the portable measurement device 106 executes computer-executable modules, such as those illustrated the FIG. 3, to implement embodiments of the invention.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of embodiments of the invention.

Embodiments of the invention may be implemented with computer-executable instructions. The computer-executable instructions may be organized into one or more computer-executable components or modules. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. A portable measurement device for determining a parameter of a battery comprising:
    a first contactor to connect to a first terminal of the battery, the first contactor comprising a first pair of leads;
    a second contactor to connect to a second terminal of the battery, the second contactor comprising a second pair of leads;
    a housing configured to house a measurement circuit, the measurement circuit comprising:
    a switch to selectively connect a resistive load to the battery via one of the first pair of leads and one of the second pair of leads;
    an analog to digital (AD) converter connected to the battery via another one of the first pair of leads and another one of the second pair of leads, and wherein the AD converter is configured to:
        receive a first voltage from the battery before the resistive load is connected to the battery and convert the first voltage to a first digital signal;
        receive a second voltage from the battery after the resistive load is connected to the battery and convert the second voltage to a second digital signal; and
        receive a third voltage from the battery after the resistive load is disconnected from the battery and convert the third voltage to a third digital signal;
    a microcontroller configured to:
        calculate voltage drop data as a function of the first, second, and third digital signals;
        retrieve voltage profile data corresponding to a voltage drop profile for a desired parameter from a memory; and
        compare the voltage drop data to the voltage profile data to determine a value of the desired parameter; and
    a display to generate the value of the desired parameter for display.

2. The device of claim 1 wherein at least one of the first and second contactors comprises a temperature sensor configured to generate an analog temperature signal and wherein:
    the AD converter is configured to convert the analog temperature signal to a first digital temperature signal; and
    the microcontroller is configured to calculate the voltage drop data as a function of the digital temperature signal.

3. The device of claim 1 wherein the desired parameter is selected from a group comprising a cold cranking amperage, a cranking amperage, an ampere hour, a watt-hour, and a reserve capacity.

4. The device of claim 1 wherein the resistive load comprises:
    a voltage rating of 12 volts;
    an ampere rating selected from a group comprising 30 amperes, 60 amperes, and 120 amperes.

5. The device of claim 1 wherein the memory is selected from a group consisting of an internal memory of the microprocessor and a removable memory.

6. The device of claim 1 wherein the second voltage decreases from a maximum level to a minimum level over a period of time, and wherein:
    the microprocessor is configured to transmit an alert signal to the display when the second voltage is at the minimum level; and
    the display is configured to generate an alert message for display in response to the alert signal, the alert message alerting a user to toggle the switch to disconnect the resistive load.

7. The device of claim 6 further comprising a sound generator configured to generate an audible alert, and wherein the microprocessor is further configured to transmit the alert signal to the sound generator to generate the audible alert.

8. The device of claim 1 wherein the display is further configured to display values for other parameters selected from a group consisting of the battery voltage, a maximum battery voltage, and a minimum voltage.

9. The device of claim 1 further comprising a communication port configured to communicate data via a communication method selected from the group consisting of:
    transferring voltage drop data and voltage profile data from the communication port to a remote computer readable medium; and
    receiving voltage drop data and voltage profile data at the communication port from the remote computer readable medium.

10. A system for obtaining a parameter measurement of a battery, the system comprising:
    a hand-held parameter measurement device comprising:
        a first contactor to connect to a first terminal of the battery, the first contactor comprising a first pair of leads;
        a second contactor to connect to a second terminal of the battery, the second contactor comprising a second pair of leads;
        a switch configured to selectively connect a resistive load to the battery via one of the first pair of leads and one of the second pair of leads;
        an analog to digital (AD) converter connected to the battery via another one of the first pair of leads and another one of the second pair of leads and wherein the AD converter is configured to:
            receive a first voltage from the battery before the resistive load is connected to the battery and convert the first voltage to a first digital signal; and
            receive a second voltage from the battery after the resistive load is connected to the battery and convert the second voltage to a second digital signal, wherein the second voltage decreases from a maximum level to a minimum level over a period time; and
        a processor configured to determine a first open circuit voltage (OCV) as a function of the first digital signal and to determine a plurality of closed circuit voltage values (CCVs) as a function of the second digital signal over the period of time, and wherein the processor comprises modules executable on the processor, the modules comprising:
            a voltage curve module to define voltage drop curve data as a function of the OCV and the plurality CCVs;
            a profile retrieval module to retrieve profile data corresponding to a voltage drop profile for a desired parameter;
            a comparison module to compare the voltage drop curve data to the profile data to determine a value of the desired parameter; and
            a display module to generate the value of the desired parameter for display on a display.

11. The system of claim 10 wherein the voltage drop curve data corresponds to a voltage drop curve and the voltage profile data corresponds to a selected voltage drop profile, wherein the selected voltage drop profile is determined from historical voltage drop curve data, and wherein the comparison module determines the value of the desired parameter based on an intersection point between the voltage drop curve and the selected voltage drop profile.

12. The system of claim 11 wherein the voltage profile data comprises a first voltage drop profile and a second voltage drop profile, wherein the selected voltage drop profile is determined as a function of a threshold voltage drop value and the voltage drop data, the threshold voltage drop value determined from another intersection point between the first and second voltage drop profiles.

13. The system of claim 12 wherein the selected voltage drop profile comprises:
the first voltage drop profile when a calculated voltage drop determined as a function of the voltage drop data is greater than the threshold voltage drop value; and
the second voltage drop profile when the calculated voltage drop is less than the threshold voltage drop value.

14. The system of claim 10 wherein at least one of the first and second contactors comprises a temperature sensor configured to generate an analog temperature signal and wherein:
the AD converter is configured to convert the analog temperature signal to a first digital temperature signal; and
the processor is configured to calculate the voltage drop data as a function of the digital temperature signal.

15. The system of claim 10 wherein the desired parameter is selected from a group comprising a cold cranking amperage, a cranking amperage, an ampere hour, a watt-hour, and a reserve capacity.

16. The system of claim 10 wherein:
a voltage rating of 12 volts:
an ampere rating selected from a group comprising 30 amperes, 60 amperes, and 120 amperes.

17. The system of claim 10 further comprising a memory to store voltage drop data and voltage profile data, and wherein the memory is selected from a group consisting of an internal memory of the microprocessor and a removable memory.

18. The device of claim 10 wherein the second voltage decreases from a maximum level to a minimum level over a period of time, and wherein:
the display module to transmit an alert signal to the display when the second voltage is at the minimum level; and
the display is configured to generate an alert message for display in response to the alert signal, the alert message alerting a user to toggle the switch to disconnect the resistive load.

19. The system of claim 10 wherein the display module is further configured to generate other parameters for display on the display, the other parameters selected from a group consisting of the battery voltage, a maximum battery voltage, and a minimum voltage.

20. A method for measuring a parameter of a battery, the method steps comprising:
connecting a first pair of leads to a first terminal of the battery;
connecting a second pair of leads to a second terminal of the battery;
selectively connecting a resistive load to the battery via one of the first pair of leads and one of the second pair of leads;
connecting an analog to digital (AD) converter to the battery via another one of the first pair of leads and another one of the second pair of leads;
receiving a first voltage at the AD converter from the battery before connecting the resistive load;
converting the first voltage to a first digital signal at the AD converter;
receiving a second voltage at the AD converter from the battery after connecting the resistive load, wherein the second voltage decreases from a maximum level to a minimum level over a period time;
converting the second voltage to a second digital signal at the AD converter;
receiving a third voltage at the AD converter from the battery after disconnecting the resistive load from the battery;
converting the third voltage to a third digital signal at the AD converter;
processing the first, second, and third digital signals at a processor to calculate voltage drop data;
retrieving, at the processor, voltage profile data corresponding to a voltage drop profile for a desired parameter from a memory and comparing the voltage drop data to the voltage profile data to determine a value of the desired parameter; and
generating the value of the desired parameter for display.

21. The method of claim 20 further comprising:
receiving an analog temperature signal via the other one of the first pair of leads and the other one of the second pair of leads at the AD converter;
converting the analog temperature signal to a digital temperature signal at the AD converter; and
processing the first, second, third, and temperature digital signals at the processor to calculate the voltage drop data.

22. The method of claim 20 wherein the memory is selected from a group consisting of an internal memory of the microprocessor and a removable memory.

23. The method of claim 20 wherein the second voltage decreases from a maximum level to a minimum level over a period of time, and wherein the method further comprises:
generating an alert signal at the processor when the second voltage is at the minimum level; and
receiving the alert signal at a display and, in response thereto, displaying an alert message to a user, the alert message alerting the user to disconnect the resistive load.

24. The method of claim 23 further comprising:
generating an audible alert signal at the processor when the second voltage is at the minimum level; and
receiving the audible alert signal from the processor at a sound generator and, in response thereto, generating an audible alert to alert the user to disconnect the resistive load.

25. The method of claim 20 further comprising generating other values for other parameters for display, the other parameters selected from a group consisting of the battery voltage, a maximum battery voltage, a minimum voltage, and a cold cranking amperage.

26. The method of claim 20 further comprising communicating data via a communication method at a communication port, the communication method selected from the group consisting of:
transferring voltage drop data and voltage profile data from the communication port to a remote computer readable medium; and
receiving voltage drop data and voltage profile data at the communication port from the remote computer readable medium.

27. The method of claim 20 wherein the desired parameter is selected from a group comprising a cold cranking amperage, a cranking amperage, an ampere hour, a watt-hour, and a reserve capacity.

* * * * *